United States Patent [19]

Gaston

[11] Patent Number: 4,931,764
[45] Date of Patent: Jun. 5, 1990

[54] LOW WEAR RESISTOR CARD FOR USE IN A LIQUID FUEL SENDER CIRCUIT

[75] Inventor: Robert D. Gaston, Dearborn Heights, Mich.

[73] Assignee: Ford Motor Company, Dearborn, Mich.

[21] Appl. No.: 290,011

[22] Filed: Dec. 27, 1988

[51] Int. Cl.⁵ .............................................. H01C 10/46
[52] U.S. Cl. ..................................... 338/185; 338/33; 338/308
[58] Field of Search ................................ 338/126–128, 338/140, 155, 157, 160, 33, 185, 162, 176, 308, 314; 29/610.1; 73/308, 313

[56] References Cited

U.S. PATENT DOCUMENTS

| | | | |
|---|---|---|---|
| 3,102,990 | 9/1963 | Miller et al. | 338/162 |
| 3,206,702 | 9/1965 | Greenwood | 338/162 |
| 3,457,537 | 7/1969 | Hines | 338/162 |
| 4,237,442 | 12/1980 | Carter | 338/180 |
| 4,243,969 | 1/1981 | Steigerwald et al. | 338/314 X |
| 4,284,969 | 8/1981 | Carbonneau | 338/183 |
| 4,318,075 | 3/1982 | Pudelko et al. | 338/314 X |
| 4,345,235 | 8/1982 | Riley et al. | 338/176 |
| 4,409,295 | 10/1983 | Smith, III et al. | 428/591 |

OTHER PUBLICATIONS

1987 Taurus/Sable Shop Manual, Sep. 1986.

Primary Examiner—C. L. Albritton
Attorney, Agent, or Firm—Paul K. Godwin, Jr.; Clifford L. Sadler

[57] ABSTRACT

A resistor card for a fuel tank level sensor configured to reduce wear between an electrical contact wiper and metalized conductor pads formed on a substrate, by the deposition of thick film resistive material on the individual pads. The resistive material forms a protective coating on the pads to protect the metalized pads from excessive wiper wear.

5 Claims, 1 Drawing Sheet

LOW WEAR RESISTOR CARD FOR USE IN A LIQUID FUEL SENDER CIRCUIT

BACKGROUND OF THE INVENTION

1. Field of the Invention

The present invention is directed to the field of liquid fuel tank monitoring systems and more specifically to the area of resistor cards employed in such systems.

2. Description of the Prior Art

In conventional liquid fuel level indicating systems for automotive vehicles such as shown in the 1987 Taurus/Sable shop manual published by the Ford Motor Co., Section 33-20, a variable resistor has its setting controlled by a float. The float is connected to a rod which is pivotally connected to sweep a wiper contact over a resistive card and thereby select a value of resistance indicative of the liquid fuel level within the tank.

A conventional resistor card 100, which is typical of those used in Ford Motor Co. vehicles, is shown in FIGS. 1A and 1B. That prior art resistor card 100 comprises a substrate 10 with a plurality of metallized conductors in groups 20, 22 and 24 depositied thereon. Each of the metallized layers is deposited on the substrate 10 so as to be electrically isolated, one from the other. A thick film resistive (ink) material 30, 32 and 34 is deposited in precise areas so as to interconnect respective groups of metallized layers 20, 22 and 24 to thereby provide precise resistant values between the metallized layers empirically determined by the shape and volume of the associated tank for which the fuel level is being measured. As can be seen in FIG. 1B, a wiper contact arm 40 makes direct contact at point 42 against the metallized layer. Although not shown, the wiper contact 40 traces an arcuate path corresponding to the arcuate arrangement of the metallized layers 20, 22 and 24 and makes contact with at least one of those layers throughout its path range.

When the card 100 is immersed within the liquid fuel, the fuel acts as a lubricant between the wiper 40 and the metallized contact layer 20, 22, or 24. However, when the card is dry because the level of the fuel in the tank has dropped below the location of the card 100, the wiper causes some wear to develop on the metallized layers. This problem has been noticed when vehicles are delivered cross-country from the factory, by rail or truck, where the fuel level in the tank is constant and the vibration caused by the transporting means produces fuel movement. Such movement causes corresponding and repeated movement of the wiper and significant wear on the metallized layers, with occasional wear-through to the substrate. In the event of wear-through, dead spots, (discontinuities) appear in the resistor card 100 and the fuel gauge observed by the operator is adversely affected when the wiper contact is in contact with such dead spots.

SUMMARY OF THE INVENTION

The present invention is intended to overcome the problems with conventional fuel sender resistor cards by providing a material overlaying the metallized conductor paths that acts to inhibit wear without significantly altering the electrical characteristics of the card.

DETAILED DESCRIPTION OF THE PREFERRED EMBODIMENT

Figure 1A:
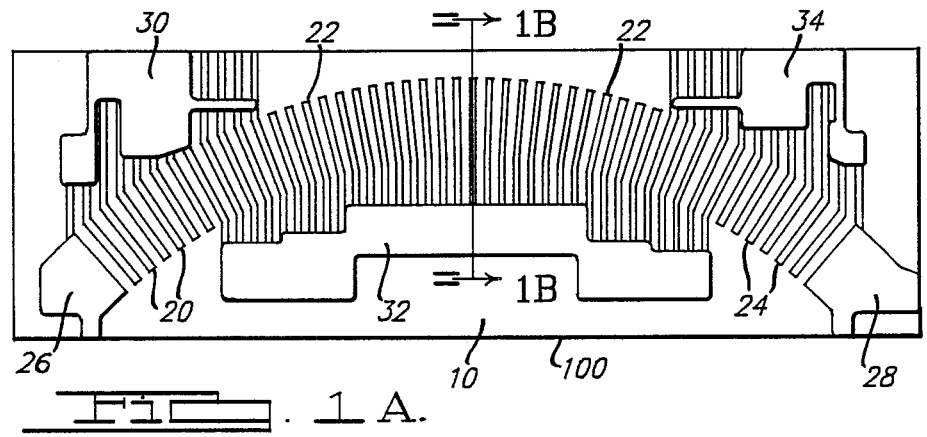
FIG. 1A is a plan view of the prior art resistor card discussed above.
Figures 1B, 2B:
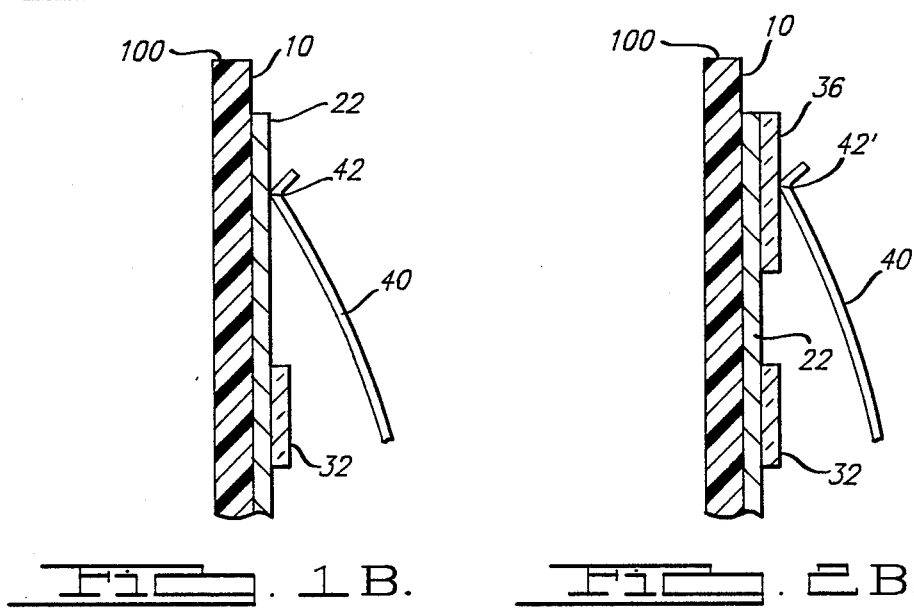
FIG. 1B is cross-sectional view of the prior art resistor card shown in FIG. 1A.
FIG. 2B is a cross-sectional view of the resistor card shown in FIG. 2A.
Figure 2A:
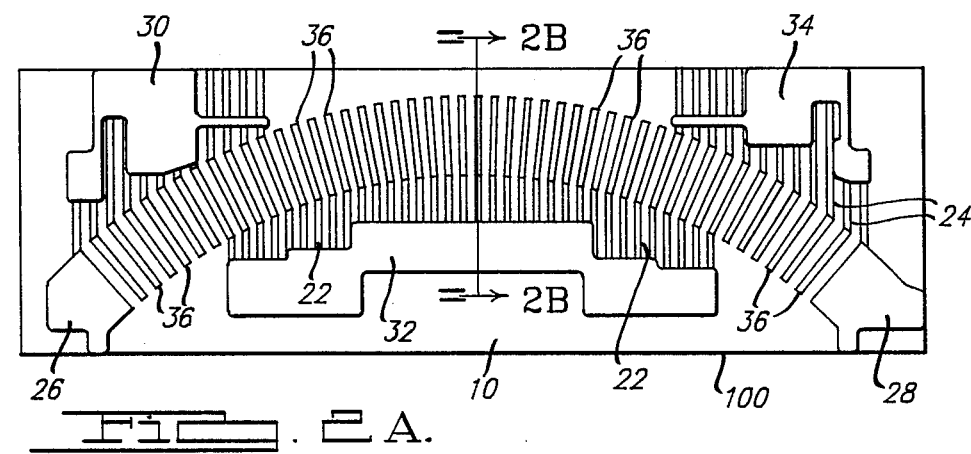
FIG. 2A is a plan view of a resistor card embodiment of the present invention.

In FIGS. 2A and 2B the present invention is shown as a deposition of a thick film resistive material 36 deposited on the pad portions of the individual metallized conductor layers 20, 22, and 24 lying in the sweep path of the conductive wiper 40. Those pads are a series of radial strips formed in an arcuate path so that the sweep of the contact wiper 40 maintains electrical contact with at least one pad during its sweep between the high and low levels of liquid within the associated tank.

The resistive thick film material 36 is the same as that employed for areas 30, 32 and 34 and is commercially available from several sources including E. I. DuPont Denemours & Co. Inc under the trade name BIROX in various formulations for resistance selection. The thick film material when distributed in areas 30, 32 and 34 in the preferred embodiment provides a selection of resistance values in a range of from 15 ohms (empty) to 160 ohms (full). However, the resistance between the contact wiper 40 at point 42' and the underlying pad is on the order of 0.01 ohms. Therefore, the addition of the thick film material 36 has no significant affect on the electrical characteristics of the card 100.

The thick film material 36 is commonly referred to as an "ink" and is deposited onto the metalized layers with conventional silk screen techniques. It is subsequently heat cured according to the manufacturers recommendations and then trimmed as necessary to ensure that the deposited material coverage corresponds to the pad area of the respective metallized conductors 20, 22 and 24. It has been found that the use of the resistive thick film material 36 on the conductive pads, provides a significant degree of protection to the metallized layers from the conductive wiper 40 that was not available otherwise. Thicknesses of the metallized layers in the described embodiment are on the order of 0.012 mm, while the thickness of the thick film resistive material is also on the order of 0.012 mm.

It is believed that the inclusion of silica and alumina in the thick film resistive material is a significant deterent to frictional wear by the conductive wiper 40, since the occurance of the wear-through problem appears to be solved. In this manner, the thick film layer 36 acts as a protective coating while at the same time providing a minimum resistance between the contact point 42' and the metallized conductor 22.

It will be apparent that many modifications and variations may be implemented without departing from the scope of the novel concept of this invention. Therefore, it is intended by the appended claims to cover all such modifications and variations which fall within the true spirit and scope of the invention.

I claim:

1. A resistor card for use in a liquid fuel sender circuit that contains a float controlled electrical wiper contact, comprising:

a substrate containing a plurality of metalized depositions in a predetermined pattern of electrically isolated areas resistively connected in series and said metalized depositions containing portions that correspond to the sweep pattern of the float controlled electrical wiper contact; and a coating of thick film resistor material deposited on said portions of metallized depositions that correspond to said sweep pattern of said float controlled electrical wiper contact.

2. A resistor card for use in a liquid fuel sender circuit that contains a float controlled electrical wiper contact, comprising:

a substrate containing a plurality of metalized depositions in a predetermined pattern of electrically isolated areas resistively connected in series and said metalized depositions containing contact pad portions that correspond to the sweep pattern of the float controlled electrical wiper contact; and a coating of thick film resistor material deposited on said contact pad portions to reside between said metalized depositions and said float controlled electrical wiper contact.

3. A resistor card for use in a liquid fuel sender circuit that contains a float controlled electrical wiper contact, comprising:

a substrate containing a plurality of metalized depositions in a predetermined pattern of electrically isolated areas resistively connected in series and said metalized depositions containing contact pad portions that correspond to the sweep pattern of the float controlled electrical wiper contact; and a coating of heat cured thick film resistor material deposited on said contact pad portions to reside between said metallized depositions and said float controlled electrical wiper contact.

4. A method of protecting metallized contact pads deposited on a substrate from wear due to repeated moving contact with a float controlled electrical wiper in an electrical liquid fuel level sensor, comprising the steps of:

applying a coating of electrically thick film resistive material on the areas defined by said individual contact pads;

curing said resistive material; and allowing said wiper to make contact with said resistive material on said pads.

5. A method of protecting metallized contact pads deposited on a substrate from wear due to repeated moving contact with a float controlled electrical wiper in an electrical liquid fuel level sensor, comprising the steps of:

applying a coating of electrically thick film resistive material on the individual contact pads;

curing said resistive material;

precisely trimming said cured resistive material to correspond to the individual contact pad areas; and allowing said wiper to make contact with said resistive material on said pads.

* * * * *